United States Patent [19]
Hall, II et al.

[11] Patent Number: 5,341,457
[45] Date of Patent: Aug. 23, 1994

[54] PERCEPTUAL CODING OF AUDIO SIGNALS

[75] Inventors: Joseph L. Hall, II, Basking Ridge; James D. Johnston, Warren, both of N.J.

[73] Assignee: AT&T Bell Laboratories, Murray Hill, N.J.

[21] Appl. No.: 109,867

[22] Filed: Aug. 20, 1993

Related U.S. Application Data

[63] Continuation of Ser. No. 962,151, Oct. 16, 1992, abandoned, which is a continuation of Ser. No. 844,967, Feb. 28, 1992, abandoned, which is a continuation of Ser. No. 292,598, Dec. 30, 1988, abandoned.

[51] Int. Cl.$^5$ .......................... G10L 7/00; G10L 3/02
[52] U.S. Cl. ................................. 395/2.35; 395/2.36; 395/2.31; 381/1
[58] Field of Search .......................... 381/1, 2, 29–35, 381/37, 47; 395/2, 2.35, 2.36, 2.39, 2.30, 2.31

[56] References Cited

U.S. PATENT DOCUMENTS

| | | | |
|---|---|---|---|
| 3,989,897 | 11/1976 | Carver | 381/47 |
| 4,349,698 | 9/1982 | Iwahara | 381/1 |
| 4,356,349 | 10/1982 | Robinson | 381/1 |
| 4,803,727 | 2/1989 | Holt et al. | 381/1 |
| 4,860,360 | 8/1989 | Boggs | 381/47 |
| 4,949,383 | 8/1990 | Koh et al. | 381/31 |
| 4,972,484 | 11/1990 | Theile et al. | 381/37 |

OTHER PUBLICATIONS

*The Art of Computer Programming*, 2nd Ed., vol. 2, Donald E. Knuth, Addison Wesley, Reading, Mass. (1981), pp. 274–275.
"Critical Distance Measurements on Rooms From the Sound Energy Spectrum Response", *Journal of the Acoustical Society of America*, vol. 65, 1979, pp. 1204–1211, Jetzt.
Chapter 5, by Betram Scharf, *Foundations of Modern Auditory Theory*, edited by Jerry V. Tobias, Academic Press, N.Y., N.Y., 1970.
"Asymmetry of Masking Between Noise and Tone", *Perception and Psychophysics II*, 1972, pp. 241–246, R. P. Hellman.
"Auditory Patterns", *Reviews of Modern Physics*, vol. 12, pp. 47–65, A. Fletcher.
"Optimizing Digital Speech Coders By Exploiting Masking Properties of the Human Ear", *Journal of the Acoustical Society of America*, vol. 66, pp. 1647–1652, M. R. Schroeder et al. (Dec. 1979).
"'MSC': Stereo Audio Coding With CD–Quality and 256 kBit/Sec", *IEEE Transactions on Consumer Electronics*, vol. CE–33, No. 4, Nov. 1987, pp. 512–519, E. F. Schroeder et al.
"Transform Coding of Audio Signals Using Perceptual Noise Criteria", *IEEE Journal of Selected Areas in Communications*, Feb. 1988, J. D. Johnston.

*Primary Examiner*—David D. Knepper
*Attorney, Agent, or Firm*—William Ryan; David M. Rosenblatt

[57] ABSTRACT

A technique for the masking of quantizing noise in the coding of audio signals is adapted to include geometric interpolation between the thresholds for a tone masking noise and for noise masking a tone, in order to reduce use of bit-rate capability where it is not necessary for transparent or high quality. The technique is usable with the types of channel coding known as "noiseless" or Huffman coding and with variable radix packing. The stereophonic embodiment eliminates redundancies in the sum and difference signals, so that the stereo coding uses significantly less than twice the bit rate of the comparable monaural signal. The technique can be used both in transmission of signals and in recording for reproduction, particularly recording and reproduction of music. Compatibility with the ISDN transmission rates known as 1 B, 2 B and 3 B rates has been achieved.

17 Claims, 7 Drawing Sheets

FIG. 3
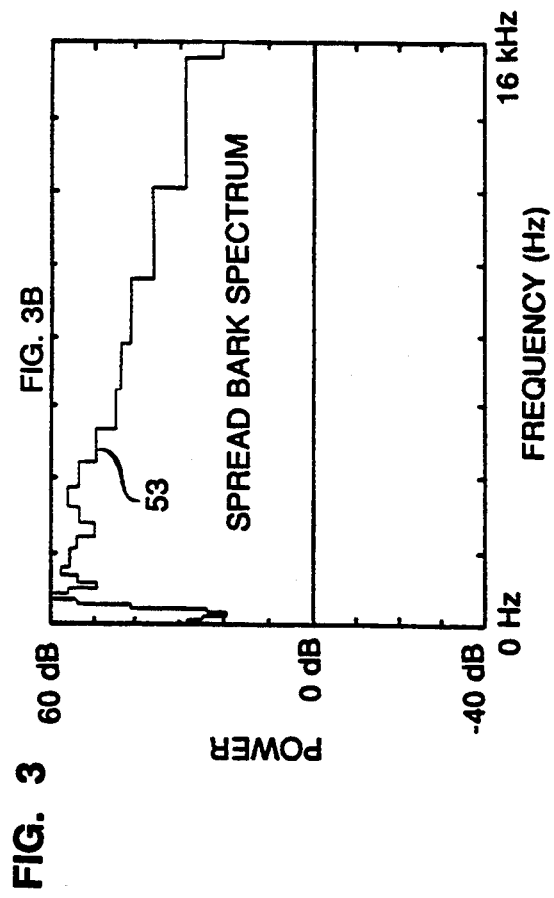
FIG. 3A
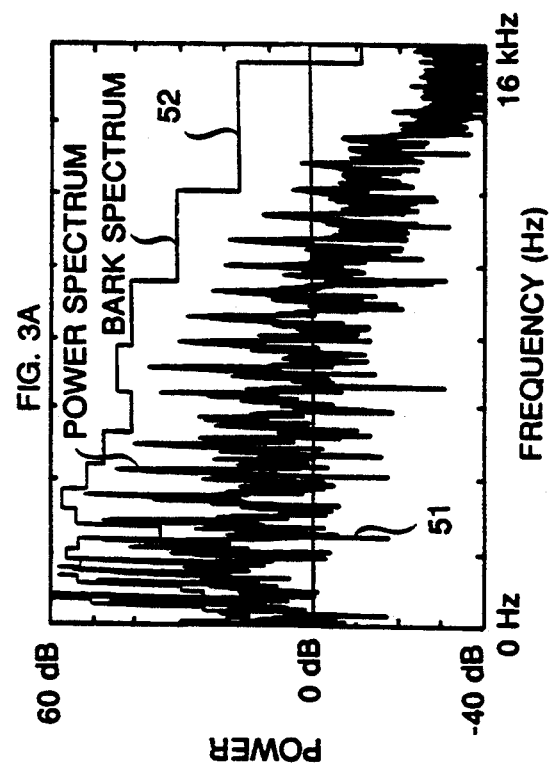
FIG. 3B
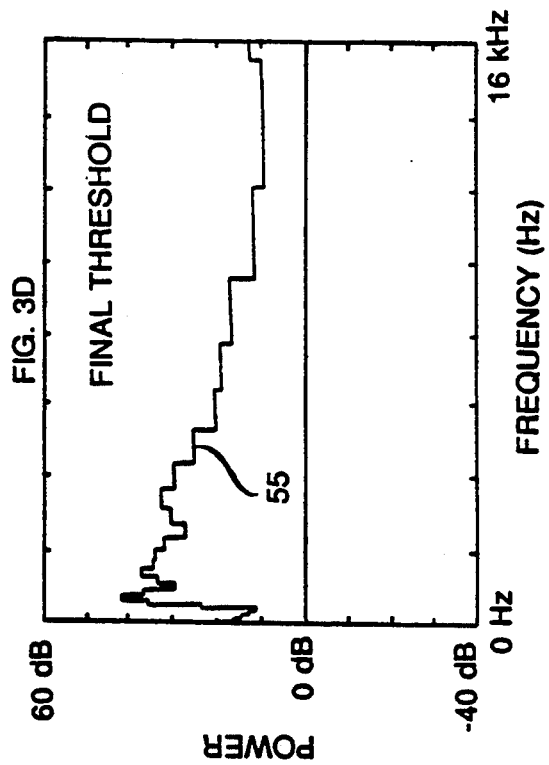
FIG. 3C
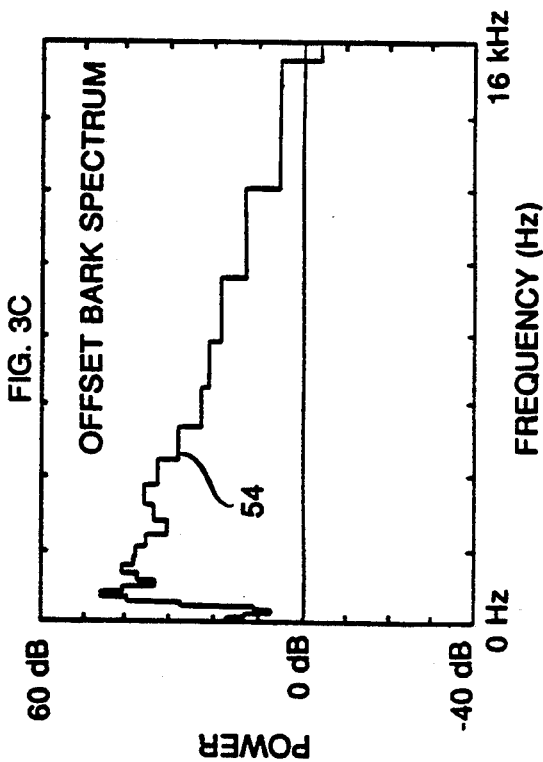
FIG. 3D

BIT RATE ADJUSTMENT PROCESS

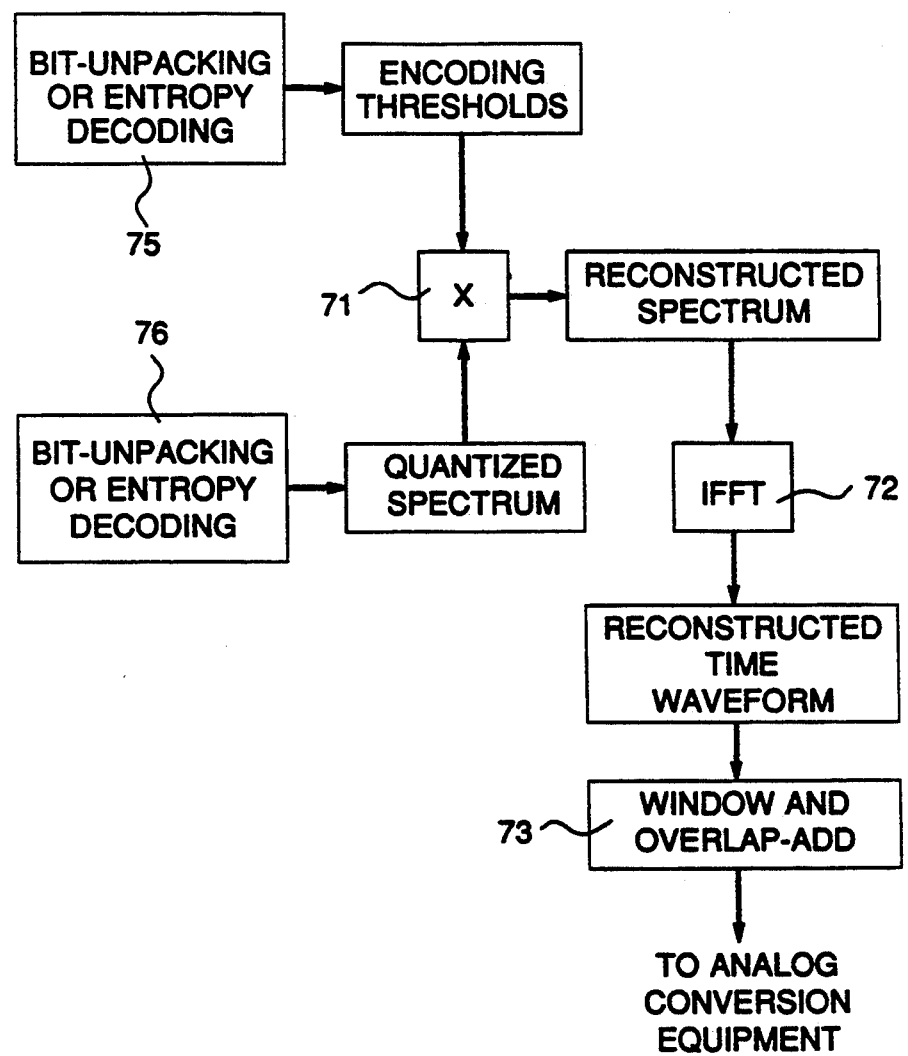
FIG: 7
PERCEPTUAL TRANSFORM DECODER
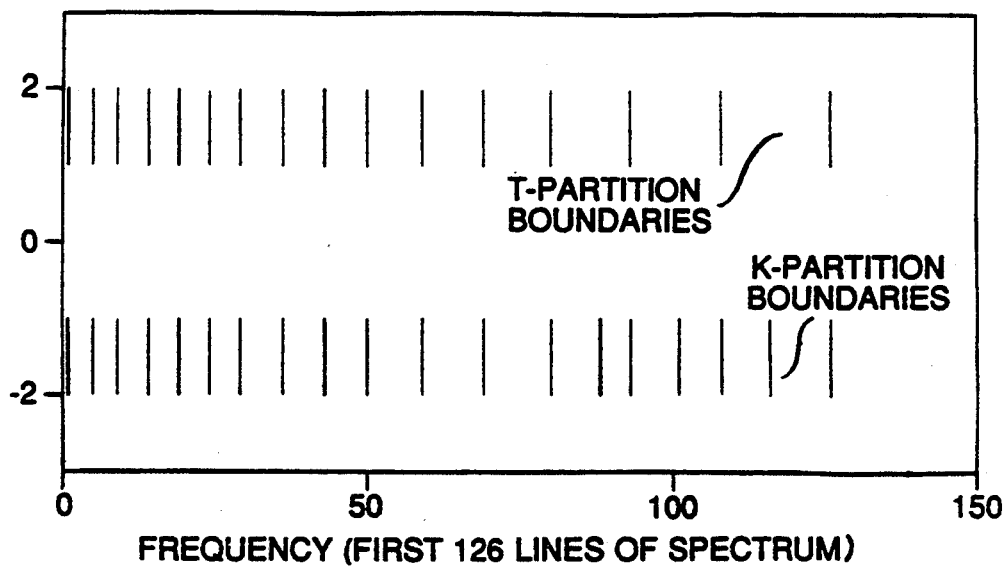
FIG. 5

PERCEPTUAL TRANSFORM DECODER STEREO VERSION

PERCEPTUAL CODING OF AUDIO SIGNALS

This application is a continuation of application Ser. No. 07/962,151, filed on Oct. 16, 1992 abandoned which is a cont. of Ser. No. 07/844,967 filed Feb. 28, 1992, now abandoned, which is a continuation of application Ser. No. 07/292,598 filed on Dec. 30, 1988, now abandoned, and claims priority thereto.

FIELD OF THE INVENTION

This invention relates to perceptually-based coding of audio signals, such as stereophonic signals.

BACKGROUND OF THE INVENTION

Demands in the commercial market for increased quality in the reproduction of audio signals have led to a revival of the investigation of digital techniques which promise the possibility of preserving much of the original signal quality. A straight-forward application of conventional digital coding would lead to excessive data rates; so acceptable techniques of data compression are needed.

One such technique is proposed by M. R. Schroeder et al in "Optimizing Digital Speech Coders By Exploiting Masking Properties of the Human Ear", *JOURNAL OF THE ACOUSTICAL SOCIETY OF AMERICA*, Vol. 66 pp. 1647–1 652 (December, 1979); and a more recent such technique is described in the article by E. F. Schroeder et al, "'MSC': Stereo Audio Coding With CD-Quality And 256 kBit/Sec", IEEE TRANSACTIONS On CONSUMER ELECTRONICS, Vol. CE-33, No. 4, November, 1987. That article proposed the use of Transform Coding with psychoacoustic processing to reduce redundancy and to keep quantizing noise below "the signal-dependent threshold of masking". The latter requirement means that the quantization process should quantize every value to be encoded with a different precision, that is, by "bit allocation." The results achieved by the technique of that article are similar to those achievable by the use of a "tone-masking-noise" psychoacoustic threshold.

SUMMARY OF THE INVENTION

One feature of our invention is based on our recognition that the properties of the signal being encoded are not purely tone-like and that a better psychoacoustic threshold can be obtained by modifying the Schroeder et al procedure to use a geometric interpolation of the respective thresholds for a tone masking noise and for noise masking a tone, with the interpolation factor determined by a tonality measure based on the short term spectrum. This feature of our invention is described and explained in an article by one of us, J. D. Johnston, "Transform Coding of Audio Signals using Perceptual Noise Criteria," IEEE JOURNAL OF SELECTED AREAS IN COMMUNICATIONS, February, 1988.

Another feature of our invention is based on our recognition that carefully designed noiseless coding of the quantized data allows the improved resolution advantages of an extra coding bit to be spread widely among the elements of a coding vector.

Further features of our invention relate to reduction of the inter-channel redundancy, acoustic mixing and other redundancies resulting from the stereophonic transducing and/or recording process.

BRIEF DESCRIPTION OF THE DRAWINGS

Other features and advantages of our invention will become apparent from the following detailed description, taken together with the drawing, in which:

FIGS. 3A–3D show curves useful in explaining in explaining the invention;

FIGS. 5 and 6 illustrate further details relating to the noiseless coding. FIGS. 7 and 8 are block diagrammatic showings of the decoders for the embodiments of FIGS. 2 and 1, respectively.

DETAILED DESCRIPTION

Figure 1:
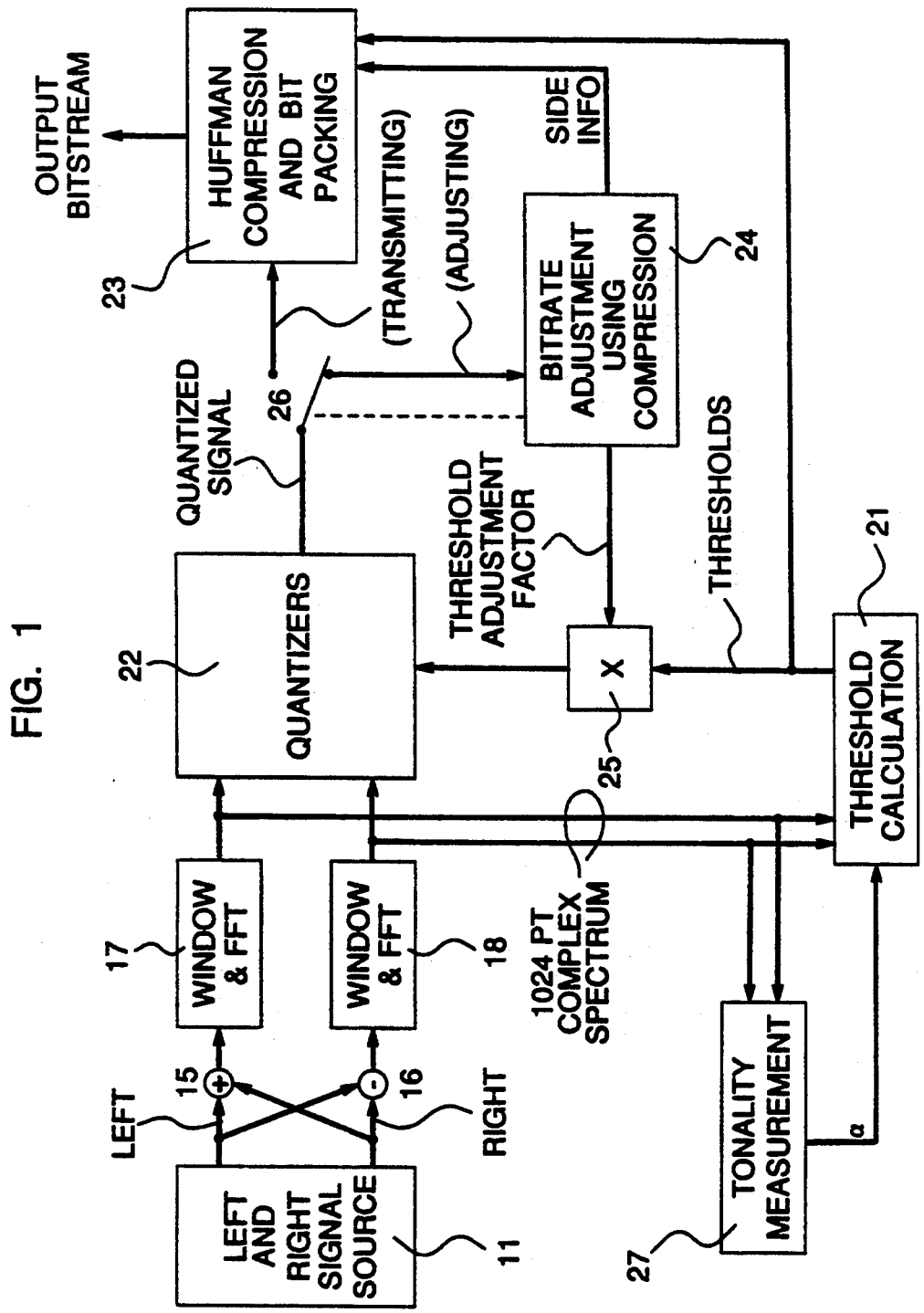
FIG. 1 is a block-diagrammatic showing of a preferred embodiment of our invention for stereo coding.
Figure 2:
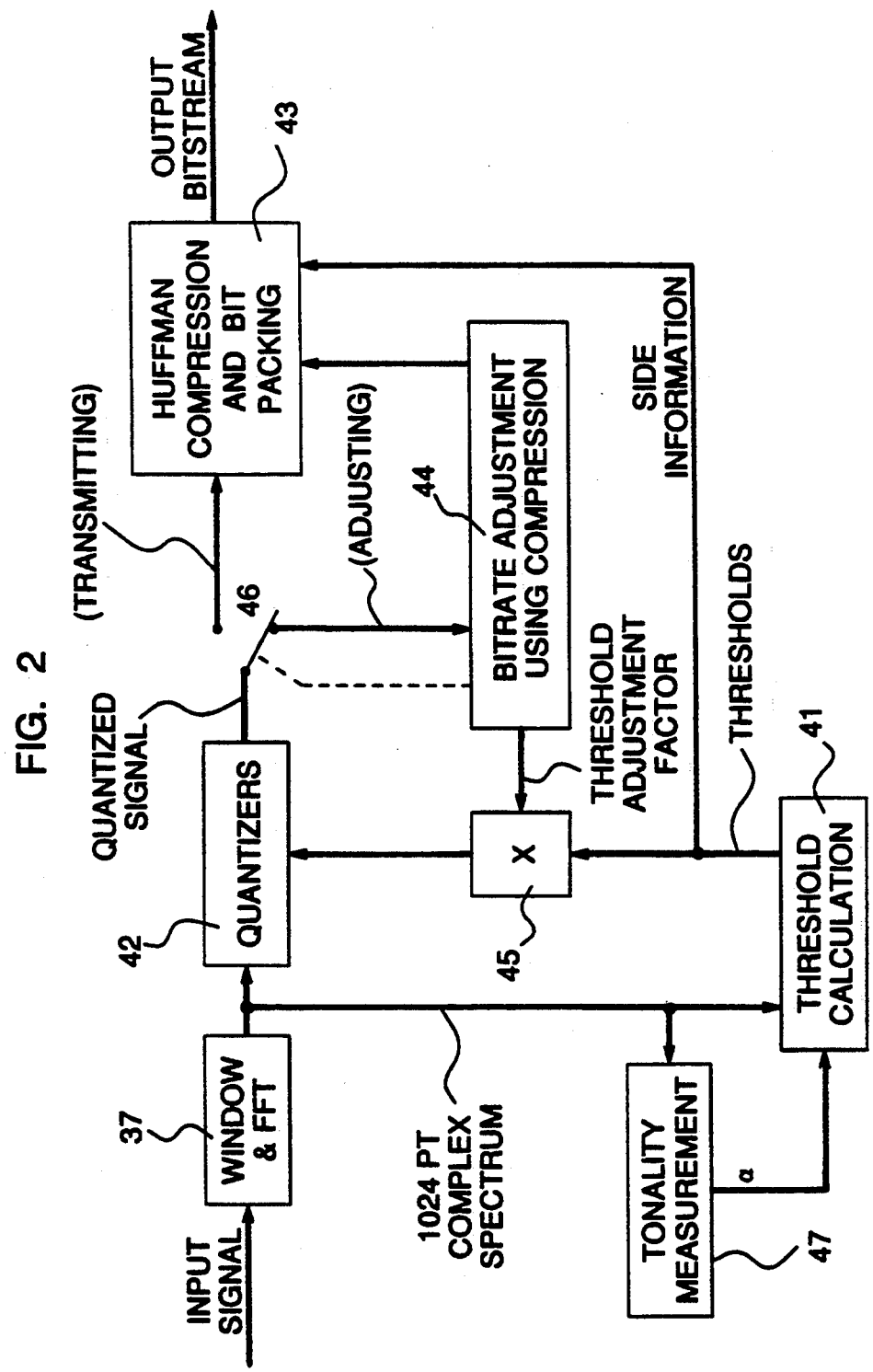
FIG. 2 is a block-diagrammatic showing of a monaural coder analogous to the stereo coder of FIG. 1.

In the embodiment of FIG. 1, the left and right signal source 11 is of a conventional type used in a stereo digital audio situation. These signals illustratively have been applied to respective channels of a low-pass filter-and-sampler circuit, wherein each signal is sampled at the same predetermined rate. Illustrative of the sampling and bandwidths rates are 32 kHz for a 15 kHz design bandwidth and 44.1 kHz for a 20 kHz design bandwidth, both high fidelity. The resulting total bit-rates that will be available from the coder of FIG. 1 for the bandwidths and sampling rates above will be 128 kb/s and 192 kb/s, which satisfy the requirements for ISDN transmission at the 2 B and 3 B rates, respectively. Other rates typical of this invention as shown in FIGS. 1 and 2 are shown in Table 1.

The sampled signals typically have been applied to their respective channels of analog-to-digital converter in signal source 11 which provides a digitally coded signal for each sample. The right and left signals are then converted to sum and difference signals in arithmetic circuits 15 and 16. Without further processing, either of the channels could require as much as 141 lkb/s to preserve enough information to be considered high fidelity (at 16 bits per sample), assuming the Audio Engineering Society Standard Format for signal encoding is used.

The primary goal in the processing that follows is to implement the use of a coding threshold that is adjusted in a way that is responsive to the sensitivities of the human ear. Information regarding the threshold can be transmitted or recorded as "side" information relatively economically in terms of bits. While such a concept can be implemented with several types of coders, a transform coder represents the most direct way to do so, as will become clearer hereinafter. The side information in this particular coder includes the quantized threshold levels and quantized spectral peak levels. This information allows the receiver or reproducing machine to recover the bit allocation as originally used by the transmitter or recording machine, thus making transmission of explicit side information on bit allocation unnecessary. Since there is no block-to-block memory in the coder, other than overlap-add (see below), the handling of rapid time transition problems is facilitated.

Each of the sum and difference signals from circuits 15 and 16 is processed further in equipments 17 and 18 so that 2048 real data points are addressed at a time, in each analysis period. This procedure is called "windowing." With a overlap ratio of one per sixteen (1/16), the number of new data points processed in each block is 1920. The remaining 128 points are from the previous block. Each such collection of data is fast-Fourier transformed in order to present it as a function of frequency. The results of the transformation can then be represented as 1024 points of a complex spectrum. The threshold for the Fourier transformed sum and difference signals from equipment 17 and 18 is then calculated in threshold calculator 21.

Before considering that in detail, let us consider the threshold calculation in the analogous monaural coder of FIG. 2. In FIG. 2, components labeled the same as in FIG. 1 are the same, except as explained hereinafter. Threshold calculator 41 works as illustrated in FIG. 3. In the upper left diagram of FIG. 3, the "Bark Spectrum", well-known in psychoacoustics, includes 25 different frequency bands, representing a partitioning of frequency into 25 bands where the masking behavior of the human ear remains approximately constant. The total of 24 frequency bands holds for the sampling rate of 32 kHz, and will vary according to the highest critical band included at a given sampling rate as the sampling rate is changed in other implementations. The exact shape of the Bark Spectrum is calculated from the short term sound spectra. The power spectrum 51 is for brass musical instruments; and the corresponding Bark Spectrum 52 is also shown. The Bark Spectrum is calculated by summing, within each critical band, the energy present in the Fourier spectrum.

The following are the steps in our calculation of the masking threshold in equipment 21 and 41:

Critical band analysis of the signal;
Applying the spreading function to the critical band spectrum;
Calculating the tonality measure from the short term spectrum;
Calculating the spread masking threshold using the tonality measurement and the two thresholds to which it relates;
Accounting for absolute thresholds;
Converting the threshold into a spectral step size for each critical band.

The first step is the critical band analysis.

We are presented with the complex spectrum Re(i),Im(i) of the signal from the FFT. The complex spectrum is converted to the power spectrum, 51, $$P(i) = Re^2(i) + Im^2(i).$$

The spectrum is then partitioned into critical bands, and the energy in each critical band summed, i.e.

$$B_n = \sum_{i=rtind(n, 0)}^{rtind(n, 1)} P(i)$$

where rtind(n,0) is the lower boundary of critical band i, rtind(n,1) is the upper boundary of critical band n, and $B_n$ is the energy in critical band n, where n=1 to $n_{max}$, and $n_{max}$ is dependent on the sampling rate. FIG. 3 shows a power spectrum 51 and critical band spectrum 52 for 64 ms of a loud brass passage.

A true critical band analysis would sum across one critical bandwidth at each i in order to create a continuous critical band spectrum. For the purposes of the calculation, the discrete critical band represents a close approximation.

Next the spreading function is applied to the critical band spectrum.

The masking estimates from Chapter 5 by Bertram Scharf of *Foundations of Modern Auditory Theory*, edited by Jerry V. Tobias, Academic Press, N.Y., N.Y., 1970 and from the article by R. P. Hellman, "Asymmetry of Masking Between Noise and Tone", *Perception and Psychophysics II*, pp. 241-246, 1922, provide information on masking of signals by signals within the same critical band. The spreading function as given in the article by M. R. Schroeder et al, "Optimizing Digital Speech Coders by Exploiting Masking Properties of the Human Ear, J. Acoustical Society of America, Vol. 66, Dec. 1979, pp. 1647-1657 is used to estimate the effects of masking across critical bands. The spreading function is calculated for abs(j−i)≦25, where i is the Bark frequency of the masked signal, and j the Bark frequency of the masking signal, and placed into a matrix $S_{ij}$. One Bark is defined to indicate a frequency difference of 1 critical band, and "Bark Frequency" corresponds with the "critical band index" of the above-cited book by Scharf. The convolution of the $B_n$ with the spreading function is implemented as a matrix multiplication, i.e. $C_n = S_{ij}*B_n$. The value of $C_n$ denotes the spread critical band spectrum. Curve 53 in FIG. 3 shows the results of spreading of the Bark spectrum 52.

The next step is to calculate the noise masking threshold.

Calculating the Noise Masking Threshold

There are two noise masking thresholds detailed in the references above. The first, for tone masking noise, is estimated as 14.5+n dB below $C_n$, where n is the Bark frequency, where this estimate is from the above cited Scharf reference, via the above-cited Schroeder reference. The second, for noise masking a tone, is estimated as 5.5 dB below $C_n$ uniformly across the critical band spectrum. The estimate for noise masking of tones is based on the above-cited article by Hellman.

In order to determine the noise-like or tone-like nature of the signal, the Spectral Flatness Measure (SFM) is used. The SFM is defined as the ratio of the geometric mean (Gm) of the power spectrum to the arithmetic mean (Am) of the power spectrum. In this use, the SFM is converted to dB, i.e., $$SFM_{dB} = 10 \log_{10} \frac{Gm}{Am},$$

and further used to generate a coefficient of tonality, $\alpha$, as follows:

$$\alpha = \min\left(\frac{SFM_{dB}}{SFM_{dBmax}}, 1.\right)$$

which means that $\alpha$ is the smaller of the two arguments shown in the parentheses, i.e. a SFM of $SFM_{dBmax} = -60$ dB is used to estimate that the signal is entirely tonelike, and a SFM of zero dB to indicate a signal that is completely noiselike. In other words, a SFM of −30 dB would result in $\alpha = 0.5$, and a SFM of −75 dB would result in $\alpha = 1.000$.

The offset ($O_n$) in dB for the masking energy in each band n is then set as $$O_n = \alpha(14.5 + n) + (1-\alpha)5.5.$$

In other words, the index α is used to interpolate geometrically between the two threshold offsets, 14.5+n dB for tones masking noise, and 5.5 dB for noise masking tones.

The threshold offset is then subtracted from the spread critical band spectrum to yield the spread threshold estimate, $T_n$:

$$T_n = 10^{log10(C_n) - \frac{O_n}{10}}.$$

Figure 4:
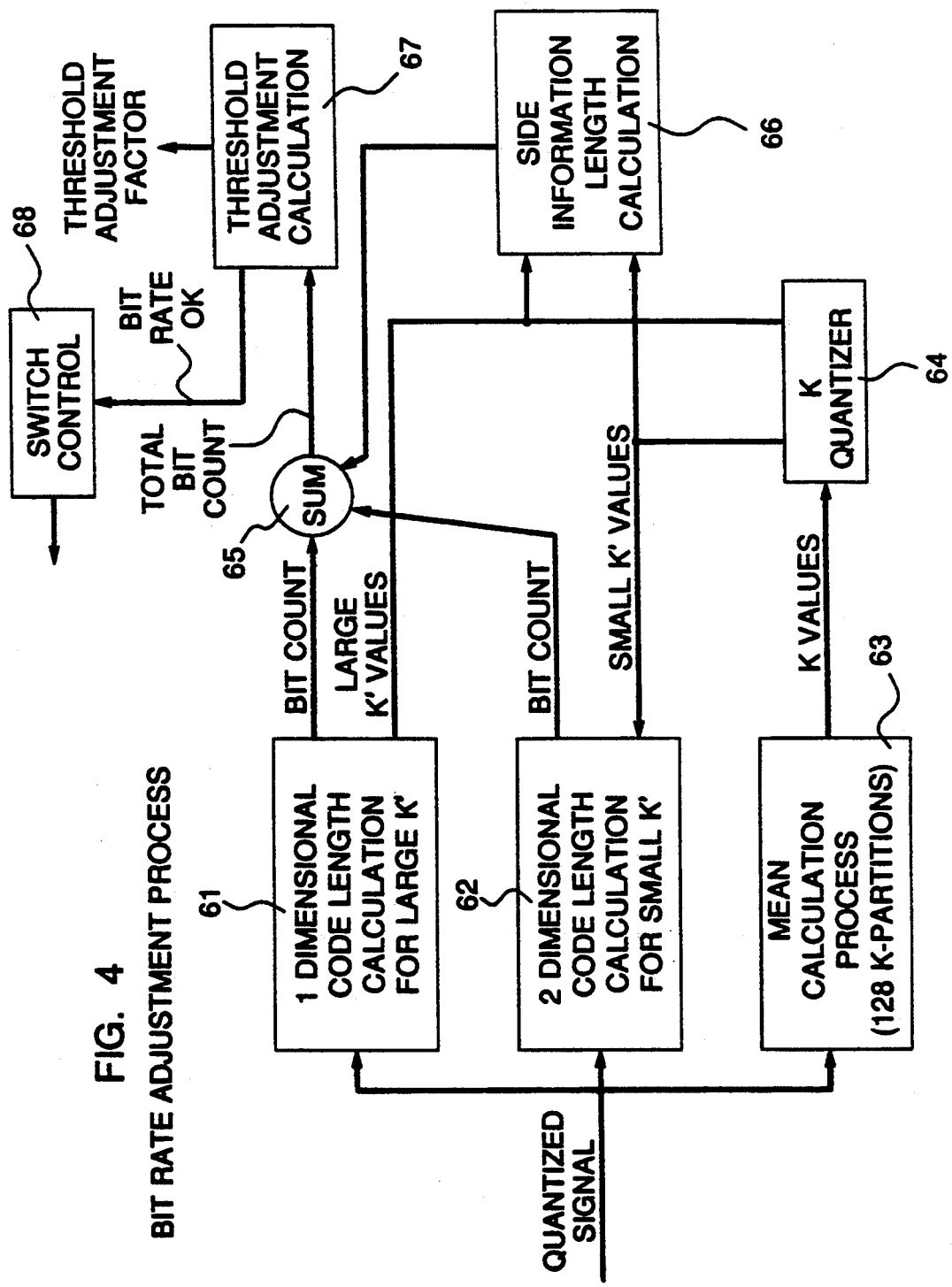
FIG. 4 is a flow diagram of the bit-rate calculation process using noiseless coding.

In practice, the use of the SFM to estimate the tonality of signals is useful, as most tonelike signals such as organ, sine waves, flute, etc have an SFM that is close to or under SFM $dB_{max}$, and signals such as percussion have SFM's, in transient sections, that are between −5 and −15 dB. Speech signals of 200–3200 Hz bandwidth are in the range of −20 to −30 dB. Curve 54 of FIG. 3 shows the plot of the spread threshold estimate for the data in FIGS. 4a and 4b.

It is now necessary to convert the spread threshold estimate $T_n$ back to the Bark domain.

Strictly speaking, the convolution of the spreading function with $B_n$ must be undone, i.e. the threshold calculated as $T_n$ should be deconvolved. This process is very unstable due to the shape of the spreading function, and often leads to artifacts such as a negative energy for a threshold, zero thresholds, etc. These unusual errors come about because the deconvolution process seeks a strictly numerical solution that disregards the physical and acoustic realities of the situation.

In place of the deconvolution, a renormalization is used. The spreading function, because of its shape, increases the energy estimates in each band due to the effects of spreading. The renormalization takes this into account, and multiplies each $T_n$ by the inverse of the energy gain, assuming a uniform energy of 1 in each band. In other words, given a flat $B_n$, and a condition where all $O_i$ are equal, it will return a flat renormalized $T_n$. This renormalized $T_n$ will be denoted $T'_n$.

We now account for available information regarding absolute thresholds.

After the noise energy is renormalized in the Bark domain, the Bark thresholds are compared to the absolute threshold measurements found in the article by A. Fletcher, "Auditory Patterns," *Reviews of Modern Physics*, Vol. 12, pp. 47–65. Since the masking thresholds have thus far been calculated without reference to absolute level, they must be checked to make sure that they do not demand a level of noise below the absolute limits of hearing.

The system gain is set such that a properly dithered signal at 4 kHz, with a peak magnitude of ±½ least significant bit in a 16 bit integer, is at the absolute threshold of hearing. Any critical band that has a calculated noise threshold lower than the absolute threshold is changed to the absolute threshold for that critical band. At high and low frequencies, the absolute threshold varies inside the critical band. In such cases, the mean of the critical band edges is used.

Curve 55 of FIG. 3 plots the final threshold, after renormalization and adjusting for absolute threshold conditions. This threshold is denoted $Th_n$. This threshold, $Th_n$, represents the noise power than can be inserted into each critical band while the signal remains perceptually uncorrupted. This threshold is used to calculate the step size that can be used for the lines in the corresponding critical bands, making the worst case assumption that the quantization error has a uniform probability density function.

The step sizes calculated according to the short-term perceptual threshold are then used as part of the bit-rate adjustment procedure, in apparatus 44. Depending on the bit-packing procedure, the short-term spectrum may or may not need to be quantized in apparatus 42 at this point in the algorithm. The final threshold, as quantized, including bit-rate adjustment effects, is called $Thr_n$.

There are two forms of bit-packing that can be used. The simpler form uses a variable radix technique that constructs binary numbers of a fixed (in this case 128 bit) length as a variable radix number. The radices can be determined both at the transmitter and receiver from the side information. This method of bit-packing allows the use of quantizers of exactly whatever size is necessary, removing the constraint that each quantizer must either have $2^n$ levels, where n is an integer or waste roundup($log_2 m$)-$log_2 m$ bits, where m is the number of levels in the quantizer, that would result from direct binary encoding.

The more complicated bit-packing algorithm uses a modified Huffman code in Huffman coder 43 of FIG. 2 with performance that varies in a data-dependent manner. If this compression method is used, the compressed bit-rate must be calculated from the quantized data (the nearest integer function of the real and imaginary parts of the spectrum divided by the $Thr_n$ appropriate) as well as from the number of levels in each quantizer.

The noiseless coding in this case is done using a set of Huffman codes that are generated from a database of music signals and stored in a codebook. Depending on the amplitude of the largest quantized data, the quantizer outputs are either quantized in pairs (real and imaginary) or as individual codewords. Another codebook is used to encode the codebook index for each pair of side information data into the set of Huffman codebooks, and that is necessarily also transmitted.

In addition to the above Huffman codebook structure, there is an additional level of codebook complexity added to allow for differing kinds of statistics in the original music. This complexity consists of having four complete sets of codebooks, each generated in a self-selecting manner from the music database in such a way that the four codebooks include the entire database and partition it in an advantageous manner. In the encoder, the set of codebooks best matched to the present block of the signal is calculated, and the best match transmitted along with the appropriate codewords.

Data Organization

In order to describe the action of the various compression and/or bit-packing algorithms, we now define a data organization for each block of data from equipment 37.

$$R_i = nint\left(\frac{Re_i}{Thr_{tind(i)}}\right) \text{ and } I_i = nint\left(\frac{Im_i}{Thr_{tind(i)}}\right)$$

is partitioned two ways as explained below. R and I are the quantized spectral lines, i is the index of the FFT output $1 \leq i \leq 2048$, nint represents a function returning the nearest integer to its argument, Thr* is the level corresponding to the quantized threshold as described below in Section 4.3, and tind(i) is explained below.

The two partitions are a critical band partition, called a t-partition, and a generally smaller partition called a k-partition. FIG. 5 shows the t-partition and k-partition boundaries for the lower part of the spectrum, given a sampling frequency of 44.1 kHz.

The t-partitions

In the above cited article by Johnston the thresholds, $Thr_n$, were generated on a critical band scale. In this implementation, the same threshold generation scheme is used. The t-partitions represent the critical band partitioning used for the threshold generation algorithm.

The t-partitions, indexed by n within this paper, are arranged so that the spectrum is segmented into $n_{max}$ partitions, each with a width of one critical band. The last t-partition is not necessarily a full critical band, but ends at $$\frac{F_s}{2}$$

For a 44.1 kHz sampling rate, $n_{max}=25$, and for a 32 kHz sampling rate, $n_{max}=24$. A list of in critical band edges may be found the the above cited reference by Schaff.

An indexing array, called tind(i) is defined such that for any i, the value of tind(i) contains the index (n) of the t-partition. An inverse array rtind(n,1) is also defined, that returns the lowest, 1=0, or highest, 1=1, values of i for a given n, where "i" represents the FFT index.

The k-partitions

Due to the width of the higher frequency critical bands, a great deal of spectral structure is obscured if the coder deals with the data strictly on a critical band basis. The k-partitions represent an empirically determined partitioning that yields a better trade-off between the side information associated with the k-partitions and the bit rate penalty due to the loss of spectral detail. The k-partitions are generally smaller than the t-partitions for higher values of k and n.

The k-partitions, indexed by k within this paper, are a set of partitions that separate the quantized spectrum into 128 sections, each averaging 8 complex lines. The boundaries of the k-partitions are selected to fulfill these rules:

No k-partition spans two t-partitions.

The k-partitions are arranged to keep the minimum and maximum length of each k-partition as close to 8 as is possible.

As with the t-partitions, indexing arrays for the k-partitions, called kind(i), which returns the k for a given i, and rkind(k,1), which returns the lowest, 1=0, and highest, 1=1, value of i for a given k, are defined.

In addition, indexing arrays for associating n with k are also defined. The array n=nkind(k) returns the index of the t-partition associated with a given k-partition, and k=knind(n) vice versa.

The above describes the data organization necessary for the compression or bit-packing algorithms. We will next describe the simpler, variable radix packing method of bit-rate calculation.

Variable Radix Bit-Rate Calculation Method

First, for each k-partition of the spectrum calculate the largest absolute value of the real and imaginary parts for each t-partition. Calculate a number $k_k$ defined as $$z_k = nint\left(\frac{LAV_k}{Thr_{nkind(k)}}\right),$$

where i represents the index of the spectral partition, nint represents the nearest integer operator, $LAV_k$ the largest absolute value of Re and Im in the partition k, and Thr is the step size for the k-partition k.

The number of levels in each set of quantizers is determined by calculating $K_k=2z_k+1$, where $K_k$ is the number of levels in each quantizer.

The number of bits required by the radix packing algorithm is then calculated by calculating $$\text{total bits} = \sum_{k=1}^{k=128} (rkind(k,1) - rkind(k,0) + 1)*\log_2 K_k.$$

The number of bits necessary for the side information, 8 bits per each of the $Thr_n$, and 6 bits per each of the 128 quantized $K_k$, are added, resulting in the total number of bits necessary for transmission of the block with this set of $Thr_n$'s.

Conditions of Threshold Adjustment

Due to the physical limits of the human ear, both for noise detection and for absolute threshold, the set of $Thr_n$ must be limited in some cases when it is multiplied by the threshold adjustment factor. These limits are descried here, and apply equally to the radix bit-packing and the entropy coded approaches. Specifically, for any critical band where the level of quantization exceeds a level known to be transparent for that critical band for all signals, regardless of type, due to the effect of the threshold adjustment factor, the $Thr_n$ is raised in that critical band in order to maintain, at maximum, that level of quantization. Additionally, if the threshold adjustment factor drops a $Thr_n$ below the absolute thresholds, the corresponding $Thr_n$ is again reset to the absolute threshold. This means that for some signals, under some conditions, there exists a maximum bit rate available from the coder, and the bits not required are either used for transmission of other information, or set to an arbitrary pattern.

Threshold Adjustment for Bit-Rate Adjustment

The bit-rate adjustment process is most easily described in pseudo-C code. Essentially, the process is a binary search, with decisions based upon the bit rate, and upon a limit to the length of the search. The bit-rate adjustment process returns a threshold adjustment factor F, that is directly multiplied with $Thr_n$ to calculate the new threshold, then used for encoding. The details of the bit-rate adjustment process are shown in Appendix 1.

Bit-Rate Adjustment in the Entropy-Coded Case

This completes the description of the bit rate calculation and adjustment for the radix packing case. We will now describe the case where entropy coding is used.

Bit Rate Calculation for the Entropy-Coded Case

For the Entropy coding, inside each k-partition, the compression algorithm must select a particular codebook. Given that the coder has no knowledge of the absolute phase of the signal, the selection method must be sign and phase independent. Additionally, since a Huffman code should fit the distribution that it is encoding, a data-related metric should be used to select the codebook used for each k-partition. The mean of the absolute value of the codewords in a k-partition is easily calculated, and provides a good first-order fit of codebook to data. This entire process is shown diagrammatically in FIG. 4.

For each k-partition, a local mean, $K_k$ is calculated:

$$K_k = \frac{\sum_{i=rkind(k,\ 0)}^{i=rkind(k,\ 1)} abs(R_i) + abs(I_i)}{2(rkind(k,\ 1) - rkind(k,\ 0) + 1)}$$

This $K_k$ is shaped by a lin+5hmic transformation and quantized:

First, if $K_k=0$, then $K'_k=0$ otherwise $K'_k=$integer(max(1,min(32, 5.614456 log$_e(K_k)$+7.759653)))

where the coefficients in the logarithmic warping are selected to approximately equalize the probabilities of $K'_k \leq 20$. The rain operation denotes a function returning the smaller argument, the max operation a function returning the larger argument, the integer operation a function returning the largest integer smaller than or equal to the argument.

Side Information Calculations

Once the $K'_k$ is calculated, the side information, except for that indicating codebook usage, can be determined. The side information consists of:

$n_{max}$ 8 bit words, quantizing the $T_n$ with a 256 level quantizer, yielding a level of $T'_n$ to be used in the spectrum quantizing process. This quantizer uses a step size of $$\frac{180}{256} dB,$$

with 0 dB corresponding to the spectral magnitude of an impulse of 1 (on a scale of ±32767), 180 being slightly larger than the largest possible spectral energy above 0 dB as defined here, and 256 being the number of levels of the quantizer.

At this point, if it is determined that the quantized threshold, $T'_n$ has not changed since the last iteration for all values of n, the calculation process is aborted, and the previous value used.

Six bits to indicate codebook usage, as defined below, two bits for each of three codebook selections. Although the correct codebooks are as yet undetermined, the number of bits required is known.

The compressed $K'_k$, where they are compressed in pairs, as $$BR_k = \sum_{k=1,\ 3,\ 5,\ 7}^{k=127}$$

encode($K'_k,K'_{k+1}$) where "encode" represents the process that looks up the codeword length, and $BR_k$ is the number of bits required for that particular codeword. Since there are 4 codebooks for the $K_k$ values (K codebooks), $BR_k$ is calculated 4 times, once for each K codebook, and the best codebook (i.e. shortest) is used.

Once this side information and its encoded bit length, typically 0.25 to 0.5 bits/sample, are known, the quantized spectrum is encoded.

Coding the Quantized Spectrum

The quantized spectrum is quantized in one of three ways on a k-partition by k-partition basis, depending on $K'_k$, for each k.

If $K'_k=0$, the quantized spectrum is not coded, and no bits are sent for that k-partition.

If $0<K'_k\leq 20$, the quantized spectrum is coded by complex pairs, i.e. each $R_i$ is matched with its corresponding $I_i$ and the pair is coded.

If $K'_k>20$, each element of R and I is coded separately.

The case where $K \leq 20$ will be discussed first, followed by the large $K'$ case.

Coding for Small Values of $K'_k$

For small values of $K'_k$, the values of $R_i$ and $I_i$ are encoded in a two-dimensional codebook that ranges in each dimension from −20 to 20. The size of these codebooks, called ij codebooks, was determined by observing the statistics of a large set of encoded signals and setting the size boundary such that roughly 5% of the signals fall out of the ij codebooks for values of K close to, but less than 20.

If the absolute value of R or I exceeds 19, as happens for the values of K' near 20, it is limited to ±20, and the codeword for the limited value is selected. In order to transmit the exact data value, another codeword is added for each limited value, taken from an 'escape' codebook, that encodes the additional magnitude of the particular component. Hence, an entry that has an absolute value of 20 indicates that another codeword from the escape codebook follows immediately.

There are four sets of two-dimensional codebooks. The one using the least number of bits over the whole frame is selected for use, and that information is included as part of the side information, above. There are not 4 alternative escape codebooks, rather one escape codebook (of four) is selected on the basis of the value of K' for that k-partition, and the information regarding escape codebook selection determined from the value of K' at the receiver.

Coding for Larger $K'_k$ Values

For the larger values of K', each R and I are encoded separately. A codebook that ranges from 1774 to +1774 is selected according to the value of K', and each part of each complex line in the k-partition is encoded separately. The value of 1774 corresponds to a worst-case estimate of the largest quantizer output value that is ever necessary to meet the perceptual masking criteria.

Figure 6:
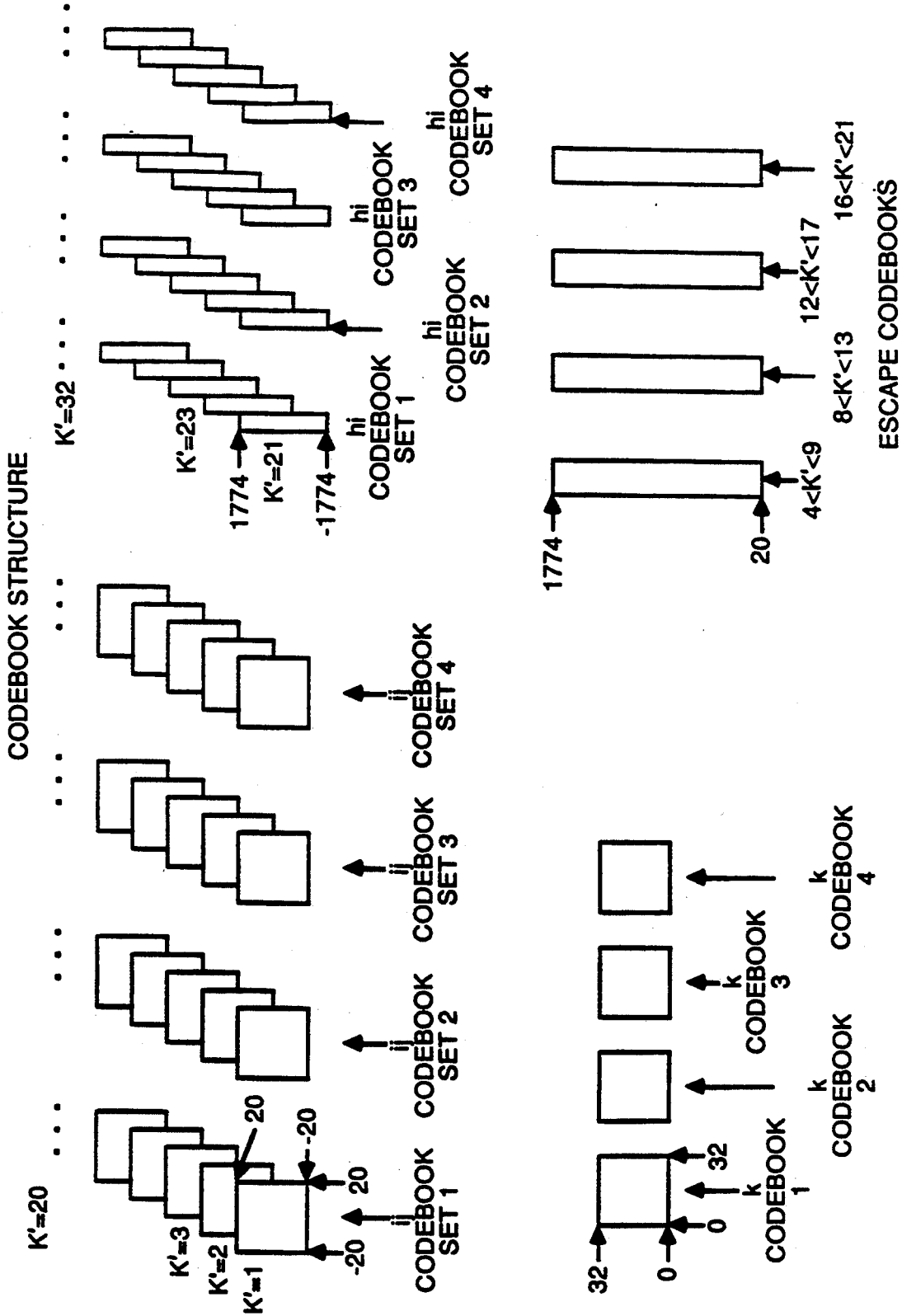

Again, 4 sets of codebooks are used, and the best set is selected. The two bits indicating this codebook represent the last two bits of side information mentioned above. The set of codebooks used for large values of $K'_k$ is called the hi codebook. An illustration of the codebook set is shown in FIG. 6.

The Bit Rate Adjustment Process

The bit rate adjustment process is most easily described in pseudo-C code. Essentially, the process is a binary search, with decisions based on the bit rate, and a limit to the length of the search. The bit rate adjustment process returns a threshold adjustment factor F, that is directly multiplied with $T_n$ to calculate the actual threshold used for encoding. The details of the bit rate adjustment process are shown in Appendix 1.

The limits to $Thr_n$ are the same as for the radix packing case. The limits on $Thr_n$, as they do in the radix packing case, sometimes set an upper bit rate limit.

Details of the Radix Packing Algorithm

The variable (mixed) radix packing method is found in the book by Donald E. Knuth, *The Art of Computer Programming*, 2nd Ed., Vol. 2, Addison Wesley, Reading, Mass. (1981), pp. 274 and 275. It uses the fact that a bit pattern representing a base two number can be generated such that an arbitrarily low loss in packing relative to the sum of $\log_2$ of the various maximum number of levels in the quantizer. The procedure generates a number in the fashion of equation 24 on page 274 of that book.

The radices are selected by:

Until the bits are all packed, fill a 128 bit word in steps, at each step doing variable radix arithmetic to encode the largest radix that will still fit in the word.

Continue this process with 128 bit words, until the entire data is expanded.

This bit-packing algorithm wastes a small amount, usually about $$\frac{1}{128},$$

of the bit-rate allocated for data. This loss can be accounted for in the initial bit-rate calculation, making calculation of the compressed data size unnecessary.

The Actual Entropy Coding Procedure

The entropy-coding algorithm for compression exactly follows the procedure for bit-rate calculation, except that the appropriate bit pattern is transmitted, instead of the length pattern added to the bit-rate. In each case, where the bit-rate for a bit pattern is found, the pattern is instead transmitted. The codebook choice is known from the rate calculation.

The Monophonic Decoder

The decoder for both the radix packing case and the entropy coding case is identical except for the decompression/unpacking algorithm. In the case of the radix packing algorithm, the order of unpacking can be unambiguously calculated from the side information, just as the transmitter calculated originally (from the quantized side information) the order of packing. The unpacking procedure follows directly from the procedure for generating the mixed-radix number.

In the case of entropy coding, the codebook information is first received and stored. Then the side information is decoded using the appropriate codebook, and stored. Once this information is stored, the appropriate codebook for each data point is known, and the appropriate codebook is used to determine the integer value of the encoded data. Once the decoded integer values of the quantized spectrum and thresholds are decoded, the data appears the same as does the data from the radix packing algorithm, and the actual transform decoder is applied.

The Transform Decoder

FIG. 7 shows a monaural perceptual transform decoder corresponding to the encoder of FIG. 2. The encoded thresholds and quantized spectrum information are combined in combining circuit 71, which may be a multiplier if the quantized spectrum has been encoded as a factor based on the corresponding threshold. These signals are derived by, in the case of the thresholds, bit-unpacking or Huffman-type decoding in apparatus 75, depending on which was used in FIG. 2, and by the same process in apparatus 76 in the case of the quantized spectrum. The output of combining circuit 71 is a reconstructed frequency spectrum, which is subjected to an inverse fast Fourier transform in apparatus 72 to provide a reconstructed time waveform. The windowing and overlap-add procedures of the encoder (e.g., FIG. 2) are reversed in apparatus 73 to yield a signal that can be subjected to digital to analog conversion or PCM storage.

Details Regarding the Stereophonic Coder

Now that the monaural coder of FIG. 2 has been described fully, let us return to the description of the embodiment of FIG. 1, for a stereo signal.

The two stereo channels, left (L) and right (R), are brought into the coder, and the signals $L+R$ and $L-R$ are developed. The two signals, $L+R$ and $L-R$, are windowed and transformed as in the monophonic coder. The spectra of the two signals are then sent to the quantizing process and to the threshold generation process. The quantizing process is the same as in the monophonic coder, except that there are two spectra to be quantized.

Generation of the Perceptual Threshold

The perceptual threshold generation is modified only in that the power spectra of the two signals are added together before the process of threshold generation is begun. This represents the assumption that the listener is more than one critical distance away fi-om the stereo speakers. The spectrum is generated as before, and sent to the threshold adjustment process. Jetzt, in his article, "Critical Distance Measurements on Rooms from the Sound Energy Spectrum Response," *Journal of the Acoustical Society of America*, Vol. 65, pp. 1204–1211 (1979), describes the term "critical distance".

The assumption that the listener is more than one critical distance away from the loudspeakers greatly simplifies the perceptual threshold generation process, as the power spectrum at either of the listeners ear can be well approximated by the sum of the power spectra of the two channels. As discussed below, this introduces some subtle effects when headphones are used. The calculation of a more complex pair of perceptual thresholds is not currently feasible, given hearing models now available.

The Threshold Adjustment Process

The threshold adjustment process is the same as in the coder of FIG. 2, except for changes in the bit rate calculation/compression algorithm detailed below.

Changes in the Bit Rate Calculation Process

There am several changes in the bit rate calculation process. The most significant one is the calculation of the bit rate for the quantization of the side information, where the various values of the spectral means $K_k$ are encoded. In the monophonic coder, two successive values of the spectral means are encoded, while in the stereo coder the value of the spectral mean for corresponding L+R and L−R signals are encoded as a pair. Since the spectra of the sum and difference signals are generally quite correlated, the total bit rate due to the set of encoded spectral means is reduced substantially.

The other change in the process is related to the fact that there are two signals, often with quite different statistics, therefore the L+R and L−R signals are each encoded the way that the monophonic spectrum was encoded in the coder of FIG. 2. In other words, there are separate codebooks selected for the sum and difference signals. This results in an additional cost of 0.002 bits/sample for the additional codebook signaling, which is more than offset by the savings resulting from the independent codebook selection.

Additional gains in coding efficiency are due to the addition of power in the sum and difference signals, and in the encoding of the sum and difference, rather than left and right, signals. In the worst case, where the spectra of the two signals am entirely uncorrelated, and the envelopes of the spectra are also uncorrelated, there is no gain, but no loss. This condition, typical of a very few electronically generated signals, is extraordinarily rare. In the case of 99+% of stereo signals, where the signals are (again, as a worst case) uncorrelated, but the spectral envelopes are very similar, a gain of 3 dB in the threshold level, and the resulting bit-rate gain, is found. In the case where the original L and R are very correlated, either negatively or positively, one of the sum or difference spectra are very small, and hence that spectrum requires few or no bits to encode, resulting in substantial gain.

Figure 8:
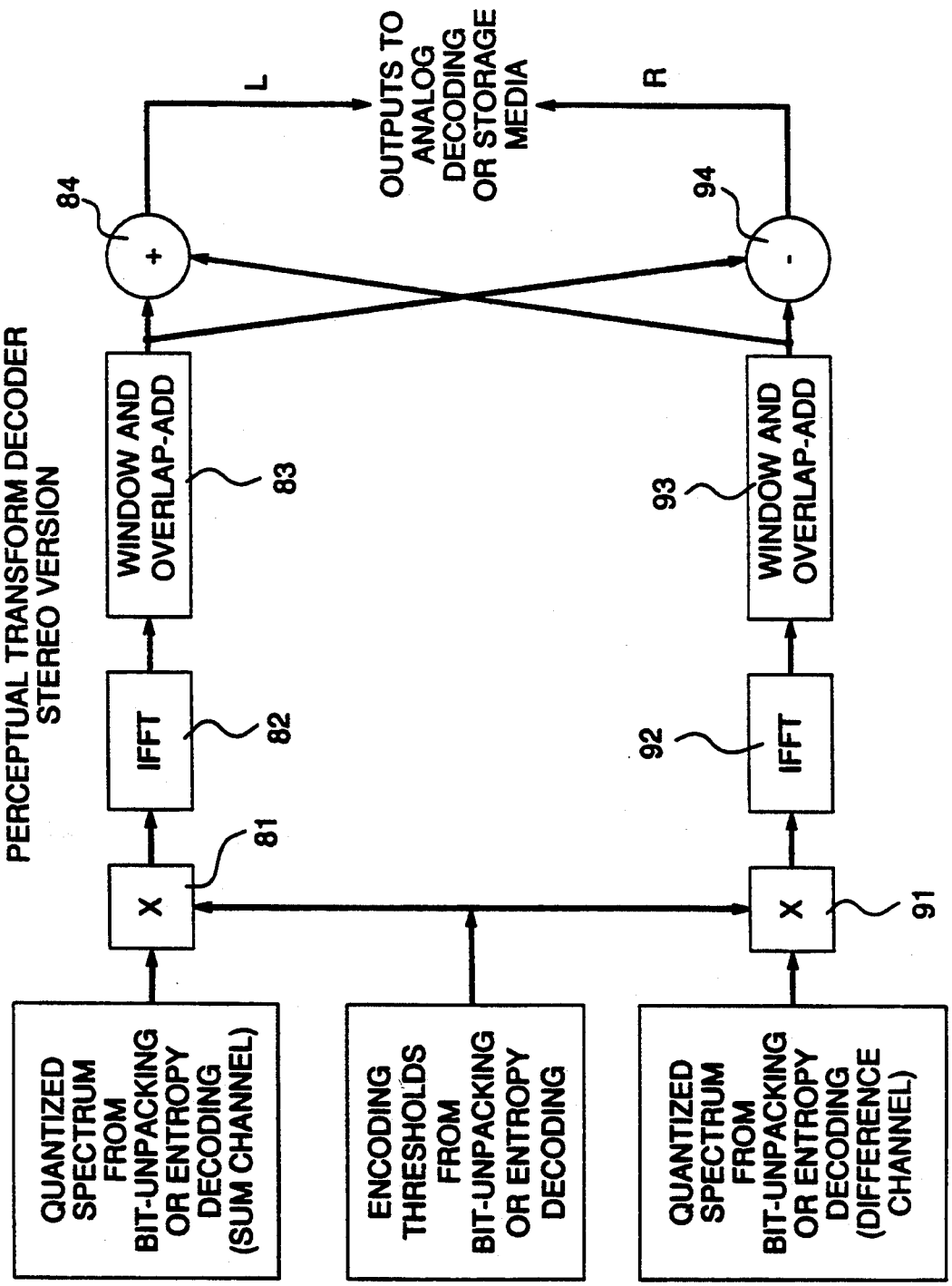

FIG. 8 shows the decoder for the stereophonic encoder of FIG. 1. Components labeled similarly perform the same functions as in FIG. 7. Other than separation of the sum and difference channels, each half of FIG. 8 is like FIG. 7 until the sum and difference channels are converted into left and right channels, respectively, in sum circuit 84 and difference circuit 94.

The decoder of FIG. 8, analogous to the monophonic decoder. The stereo encoder's preferred embodiment uses the entropy coding, nevertheless the use of radix bit-packing is possible by directly extending the methods used in the radix-packing monophonic coder.

While the summing of the power spectra for the two channels is true, strictly speaking, only for the case where the listener is using speakers in a normally reverberant room, the loss in psychoacoustic masking when the listener is using headphones has been found to be very small in the worst case, due perhaps to psychoacoustic cross-masking and the bit-rate adjustment procedure that usually drives the $Thr_j$ well below that which would be considered at the edge of audibility.

Codebook Design for the Entropy Coder

In order to design the codebooks for the entropy coder, a large database of different, unrelated audio signals at the appropriate sampling rate is gathered. The following steps are then used to develop the codebooks used in the actual encoder and decoder.

1. First, using the unadjusted bit-rate (before bit-rate adjustment), calculate a complete codebook for each 25% of the initial rate, i.e. the lowest 25% is used to generate one codebook, the next 25% for the second, and so on.
2. Using the currently designed codebook set, run through the entire audio database, doing the following:

a. Calculate the bit rate, using the complete bit rate adjustment procedure, for each of the four codebooks.
   b. Choose the best codebook (also recognizable as the codebook that permits the smallest $Thr_j$'s).
   c. Keep the history for the best codebook for each short-term section of the audio database. This provides a histogram for each of the codebook selections that corresponds to the best fitting data for each.
3. Take the four collected histograms, and generate a new codebook for each histogram.
4. Proceed from step two, until the bit-rate gain from an iteration is minimal.

This procedure uses two methods to ensure that a reasonable clustering is found. First, the selection of the best codebook for each short-term spectrum, which can only result in the same (if the same codebook which was used on the previous iteration is selected) bit-rate, or a better bit-rate (if any other codebook is selected, representing an overall gain), and second, the generation of the next codebook from the actual data histogram of the database for those sections that are clustered together by reason of having the same best codebook, which results in a new codebook set with the same (if nothing changed from the previous iteration) or better statistical match to the data, and hence the same or better compression rates.

TABLE I

| Bandwidth kHz | Mono/Stereo M/S | Sampling Rate kHz | Bit Rate kb/s | Quality | Compression Type |
|---|---|---|---|---|---|
| 6.5 | M | 14.0 | 56.0 | Near Transparent | Radix |
| 7.4 | M | 16.0 | 64.0 | Near Transparent | Radix |
| 7.4 | S | 16.0 | 96.0 | Near Transparent | Entropy |
| 7.4 | S | 16.0 | 112.0 | Near Transparent | Radix |
| 15.0 | M | 32.0 | 96.0 | Transparent | Entropy |
| 15.0 | M | 32.0 | 128.0 | Transparent | Radix |
| 15.0 | S | 32.0 | 128.0 | High Quality | Entropy |
| 15.0 | S | 32.0 | 192.0 | High Quality | Radix |
| 20.0 | M | 44.1 | 128.0 | High Quality | Radix |
| 20.0 | M | 44.1 | 128.0 | Transparent | Entropy |
| 20.0 | S | 44.1 | 192.0 | Transparent | Entropy |
| 20.0 | S | 44.1 | 256.0 | Transparent | Radix |

Appendix 1

```
float
bradj()
{
    extern float brmax, brmin;  /* maximum and minimum set bit
    rates */
    int icnt, hiflag, loflag;  /* internal variables */
    float currentbr,thradj,delta;  /* internal variables */
    hiflag=0;  /* ==1 if last br was high */
    loflag=0;  /* ==1 if last br was low */
    icnt=0;  /* counts number of iterations */
    thradj=1;  /* initial threshold adjustment factor */
    delta=sqrt(2);  /* initial step size for threshold
    change */
    currentbr=brcalc(thradj);  /* brcalc is the above bit rate
    calculation procedure */
    while ((currentbr <= brmax) && ((currentbr >= brmin)
    (inct>=16))){
        inct++;  /* count iterations */
        if (currentbr < brmin) {  /* bit rate low */
            if (hiflag == 1) {  /* if it was high */
                hiflag=0;  /* change
                state, shrink step size */
```

-continued

Appendix 1

```
            delta=sqrt(delta);
        }
        thradj=thradj/delta; /* shrink
            threshold size */
        loflag=1; /* confirm state */
    }
    else { /* bit rate is high */
            if (loflag == 1) {/* if it was low */
                loflag=0; /* change
                    state, shrink step size */
                delta=sqrt(delta);
            }
            thradj=thradj*delta; /* raise
                threshold size */
            hiflag=1; /* confirm state *
        }
        currentbr=brcalc(thradj); /* calculate adjusted bit rate *
    }
    return thradj;
}
```

We claim:

1. A method of processing an ordered time sequence of audio signals partitioned into a set of ordered blocks, each said block having a discrete frequency spectrum comprising a first set of frequency coefficients, the method comprising, for each of said blocks, the steps of:
   (a) grouping said first set of frequency coefficients into at least one group, each group comprising at least one frequency coefficient;
   (b) generating at least one tonality value, each group having an associated tonality value, said at least one tonality value reflecting the degree to which said time sequence of audio signals comprises tone-like quality;
   (c) generating at least one noise masking threshold, each said at least one noise masking threshold being based upon at least a portion of said at least one tonality value; and
   (d) quantizing at least one frequency coefficient in said at least one group, said quantizing based upon said at least one noise masking threshold.

2. The method of claim 1 wherein said discrete frequency spectrum further comprises a second set of frequency coefficients, said first set of frequency coefficients in combination with said second set of frequency coefficients representing all frequencies present in each said block.

3. The method of claim 1 wherein each said group in said at least one group comprising more than one frequency coefficient comprises more than one contiguous frequency coefficient.

4. The method of claim 1 further comprising the step of coding said quantized set of groups using Huffman codes.

5. The method of claim 1 wherein each said block is representable by a number of bits, said number of bits having a predetermined range, said quantizing is based on said number of bits.

6. The method of claim 5 wherein said step of quantizing said at least one frequency coefficient in said at least one group comprises quantizing all frequency coefficients in said first set of frequency coefficients and wherein said method further comprising, for each block, the steps of:
   (a) generating an amount of bits needed to represent said first set of frequency coefficients in a quantized form;
   (b) comparing said amount of bits to said number of bits;
   (c) adjusting each said at least one noise masking threshold; and
   (d) repeating set (d) of claim 1 and steps (a) through (c) until said amount of bits is within said predetermined range of said number of bits.

7. The method of claim 1 wherein said ordered time sequence of audio signals represents a first channel and a second channel of a stereo signal, the method further comprising, for each of said blocks, the steps of:
   (a) generating a first power spectrum, said first power spectrum being representative of said first channel;
   (b) generating a second power spectrum, said second power spectrum being representative of said second channel;
   (c) adding said first power spectrum to said second power spectrum prior to said determining at least one noise masking threshold; and
   (d) applying each of said at least one noise masking threshold to said first channel and said second channel.

8. The method of claim 7 wherein the first channel is L and the second channel is R.

9. The method of claim 7 wherein the first channel is L+R and the second channel represents a difference between L and R.

10. A storage medium manufactured in accordance with a process comprising the steps of:
    (a) processing an ordered time sequence of audio signals partitioned into a set of ordered blocks, each said block having a discrete frequency spectrum comprising a first set of frequency coefficients; and
    (b) for each of said blocks:
        (1) grouping said first set of frequency coefficients into at least one group, each group comprising at least one frequency coefficient;
        (2) generating at least one tonality value, each group having an associated tonality value, said at least one tonality value reflecting the degree to which said time sequence of audio signals comprises tone-like quality;
        (3) generating at least one noise masking threshold, each said at least one noise masking threshold being based upon at least one tonality value;
        (4) quantizing at least one frequency coefficient in said at least one group resulting in a set of quantized frequency coefficients, said quantizing based upon said at least one noise masking threshold;
        (5) applying a recording signal to said storage medium, said recording signal comprising signals representing said set of quantized frequency coefficients; and
        (6) recording said recording signal onto said storage medium.

11. The method of claim 10 wherein said storage medium is a compact disc.

12. The method of claim 10 wherein said storage medium is a digital storage means.

13. A method of transmitting audio signals, the method comprising the steps of:
    (a) processing an ordered time sequence of audio signals partitioned into a set of ordered blocks, each said block having a discrete frequency spectrum comprising a first set of frequency coefficients; and (b) for each of said blocks:
- (1) grouping said first set of frequency coefficients into at least one group, each group comprising at least one frequency coefficient;
- (2) generating at least one tonality value, each group having an associated tonality value, said at least one tonality value reflecting the degree to which said time sequence of audio signals comprises tone-like quality;
- (3) generating at least one noise masking threshold, each said at least one noise masking threshold being based upon at least one tonality value;
- (4) quantizing at least one frequency coefficient in said at least one group resulting in a set of quantized frequency coefficients, said quantizing based upon said at least one noise masking threshold;
- (5) generating a transmission signal comprising signals representing said set of quantized frequency coefficients; and
- (6) applying said transmission signal to a transmission medium.

14. The method of claim 13 wherein said transmission medium is a broadcast transmission medium.

15. The method of claim 13 wherein said transmission medium is an electrical conducting medium.

16. The method of claim 13 wherein said transmission medium is an optical transmission medium.

17. A method for generating signals representing an ordered time sequence of audio signals partitioned into a set of ordered blocks, each said block having a discrete frequency spectrum comprising a first set of frequency coefficients, the method comprising, for each of said blocks, the steps of:
- (a) grouping said first set of frequency coefficients into a plurality of groups, each group in said plurality of groups representing a critical band of frequencies and comprising at least one frequency coefficient;
- (b) generating a tonality value for each said group in said plurality of groups of frequency coefficients, said tonality values reflecting the degree to which said time sequence of audio signals comprises tone-like quality;
- (c) generating a noise masking threshold for each said group in said plurality of groups of frequency coefficients, each said noise masking threshold being based upon said tonality value for the respective group; and
- (d) quantizing each frequency coefficient in said at least one frequency coefficient in each said group, said quantizing being based upon said noise masking threshold associated with said group and a predetermined number of bits.

* * * * *